(12) United States Patent
Chou et al.

(10) Patent No.: US 8,013,400 B1
(45) Date of Patent: Sep. 6, 2011

(54) METHOD AND SYSTEM FOR SCALING CHANNEL LENGTH

(75) Inventors: Li-Heng Chou, Portland, ME (US); Jiankang Bu, Windham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 521 days.

(21) Appl. No.: 12/148,562

(22) Filed: Apr. 21, 2008

(51) Int. Cl.
*H01L 27/088* (2006.01)
*H01L 21/44* (2006.01)
*H01L 21/311* (2006.01)

(52) U.S. Cl. ............... 257/401; 257/E21.023; 438/669; 438/753

(58) Field of Classification Search ............... 438/618, 438/637, 671, 736, 669, 753; 257/401
See application file for complete search history.

(56) References Cited

U.S. PATENT DOCUMENTS

| | | | |
|---|---|---|---|
| 3,974,443 A | 8/1976 | Thomas | |
| 4,024,561 A | 5/1977 | Ghatalia | |
| 4,672,314 A | 6/1987 | Kokkas | |
| 5,485,097 A | 1/1996 | Wang | |
| 5,950,090 A * | 9/1999 | Chen et al. | 438/296 |
| 6,246,973 B1 | 6/2001 | Sekine | |
| 6,275,972 B1 | 8/2001 | Long et al. | |
| 6,456,082 B2 | 9/2002 | Nowak et al. | |
| 6,559,672 B2 | 5/2003 | Yamaguchi | |
| 6,660,542 B1 * | 12/2003 | Stirton | 438/16 |
| 6,727,724 B2 | 4/2004 | Yamaguchi | |
| 6,731,130 B1 | 5/2004 | Yang et al. | |
| 6,756,242 B1 * | 6/2004 | Regan | |
| 6,777,340 B1 * | 8/2004 | Chiu et al. | |
| 6,859,748 B1 | 2/2005 | Yang et al. | |
| 6,885,214 B1 | 4/2005 | Su et al. | |
| 6,998,314 B2 * | 2/2006 | Prall | 438/270 |
| 7,038,469 B2 | 5/2006 | Coutu | |
| 7,094,645 B2 * | 8/2006 | Swift et al. | 438/261 |
| 7,185,294 B2 * | 2/2007 | Zhang | 716/2 |
| 7,221,031 B2 * | 5/2007 | Ryoo et al. | 257/393 |
| 7,263,477 B2 | 8/2007 | Chen et al. | |
| 7,319,067 B2 * | 1/2008 | Chou et al. | 438/637 |
| 7,514,940 B1 | 4/2009 | Bu | |
| 7,723,203 B2 * | 5/2010 | Kim | 438/401 |
| 2002/0102752 A1 | 8/2002 | Huang et al. | |
| 2002/0167034 A1 | 11/2002 | Yamaguchi et al. | |
| 2002/0182757 A1 | 12/2002 | Conchieri et al. | |
| 2004/0021473 A1 | 2/2004 | Tsai et al. | |
| 2004/0180490 A1 * | 9/2004 | Yamamoto | 438/200 |
| 2005/0003675 A1 * | 1/2005 | Carducci et al. | 438/710 |
| 2006/0071676 A1 | 4/2006 | Chen et al. | |
| 2006/0237800 A1 * | 10/2006 | Rudeck | 257/384 |

(Continued)

OTHER PUBLICATIONS

Chian-Yuh Sin et., al., "Resist trimming technique in CF.sub4./O.sub2. high-density plamas for sub-0.1 micron MOSFET fabrication using 248-nm lithography", Elsevier Science, Journal Microelectronic Engineering, vol. 65 (2003), pp. 394-405.*

S. Joe Qin et al., "Semiconductor manufacturing process control and monitoring: A fab-wide framework", Elsevier Science, Jounal of Processs Control, vol. 16 (2006), pp. 179-191.*

(Continued)

*Primary Examiner* — W. David Coleman

(57) ABSTRACT

A method for scaling channel length in a semiconductor device is provided. The method includes increasing a pitch to reduce a development inspection critical dimension (DICD) for a plurality of polysilicon lines. The polysilicon lines are trimmed to provide a reduced-size channel length, based on the reduced DICD, for each polysilicon line. For a particular embodiment, the semiconductor device is fabricated using a photolithography tool having a wavelength of 248 nm, the pitch is about 800 nm, and the reduced-size channel length is about 0.11 μm.

20 Claims, 5 Drawing Sheets

U.S. PATENT DOCUMENTS

2007/0128797 A1*  6/2007  Cho ............................... 438/257
2008/0093627 A1*  4/2008  Ting et al. ...................... 257/190
2008/0160738 A1*  7/2008  Cho ............................... 438/585
2009/0061615 A1*  3/2009  Cho et al. ....................... 438/618
2009/0174036 A1*  7/2009  Fuller et al. ................... 257/618

OTHER PUBLICATIONS

Makoto Sasaki et al., "A New Method to Determine Effective Channel Length, Series Resistance and Threshold Voltage," Proceedings of the 1996 IEEE International Conference on Microelectronic Test Structures, vol. 9, Mar. 1996, pp. 139-144.

* cited by examiner

METHOD AND SYSTEM FOR SCALING CHANNEL LENGTH

TECHNICAL FIELD

This disclosure is generally directed to semiconductor device fabrication. More specifically, this disclosure is directed to a method and system for scaling channel length in CMOS devices.

BACKGROUND

In CMOS device fabrication, several factors that motivate device scaling include shorter channel lengths and the higher speed and reduced power requirements that result from the shorter channel lengths. For example, a ring oscillator based on a 0.18-μm CMOS platform has a gate delay time of more than 20 ps. However, if the channel length is scaled to 0.11 μm, the gate delay time may be reduced to about 15 ps. In addition, using this type of high-speed device in an analog-to-digital converter allows speeds of up to 1 Giga-sample/second.

In 200-mm fabrication, the most advanced process is a 0.18-μm CMOS process, which employs a photolithography tool having a wavelength of 248 nm. This photolithography tool is incapable of printing any 0.11-μm features on a wafer under conventional processing. In order to implement a 0.11-μm process, the fabrication process is required to upgrade to a photolithography tool having a wavelength of 193 nm. However, this type of photolithography tool is extremely expensive, costing in the millions of dollars.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 8, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
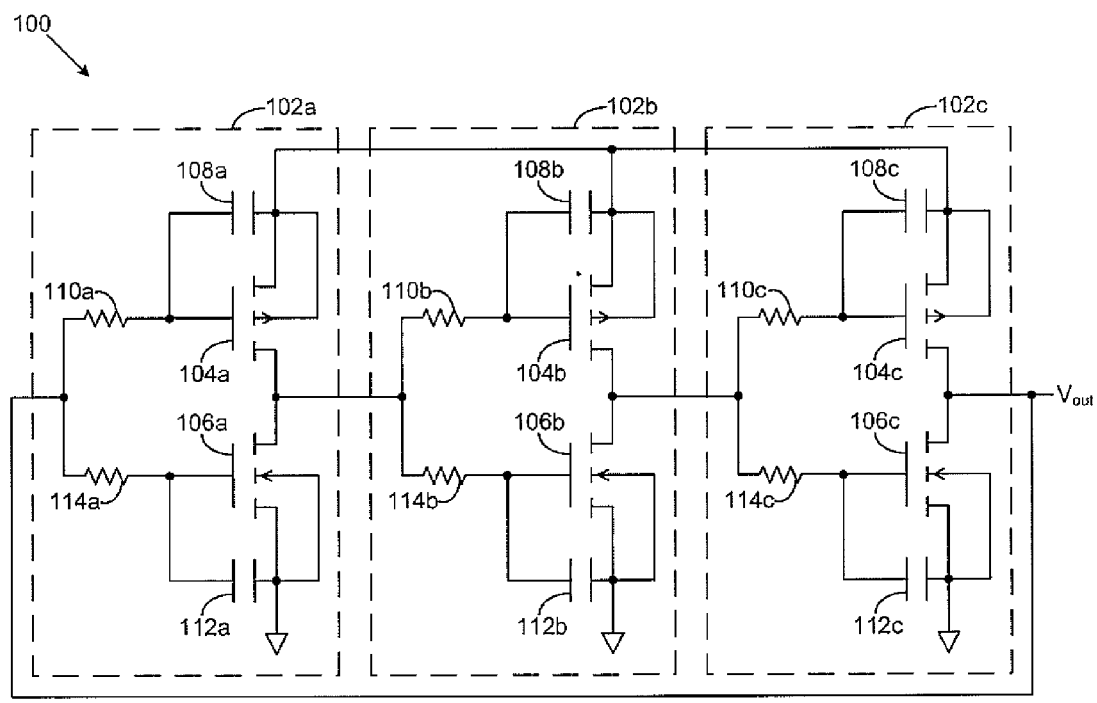
FIG. 1 illustrates a ring oscillator that may be fabricated in accordance with one embodiment of this disclosure.

FIG. 1 illustrates a ring oscillator 100 that may be fabricated in accordance with one embodiment of this disclosure. The ring oscillator 100 comprises an odd number of inverters 102. Although the illustrated embodiment of the ring oscillator 100 comprises three inverters 102a-c, it will be understood that the ring oscillator 100 may comprise any suitable odd number of inverters 102. The inverters 102 are coupled to each other in series such that the output of each inverter 102 is the opposite of the output of the immediately previous inverter 102.

The final output voltage, $V_{out}$, of the ring oscillator 100, which is the opposite of the previous input voltage at the first inverter 102a due to the odd number of inverters 102, is fed-back as a subsequent input to the first inverter 102a. After the gate delays associated with the three inverters 102a-c, the final output voltage switches to the opposite of the previous output voltage. Thus, the output voltage oscillates between two voltage levels based on a frequency associated with the number of inverters 102 and their associated gate delays.

For the illustrated embodiment, each inverter 102 comprises a PMOS transistor 104 and an NMOS transistor 106. The PMOS transistor 104 is coupled to a capacitor 108 and a resistor 110, and the NMOS transistor 106 is coupled to a capacitor 112 and a resistor 114. For a particular embodiment, the capacitors 108 and 112 may each have a capacitance of about 0.01 pF, and the resistors 110 and 114 may each have a resistance of about 500 Ω.

As described in more detail below, the ring oscillator 100 is one example of a circuit that may be formed from transistors 104 and 106 having channel lengths that are scaled to about 0.11 μm without the use of an expensive, 193-nm wavelength photolithography tool. Instead, a conventional 248-nm wavelength photolithography tool may be used to fabricate the transistors 104 and 106. In this way, the inverters 102 of the ring oscillator 100 may have a gate delay time that is reduced to about 15 ps, resulting in a higher frequency oscillation than would be possible with a conventionally fabricated ring oscillator.

Figure 2:
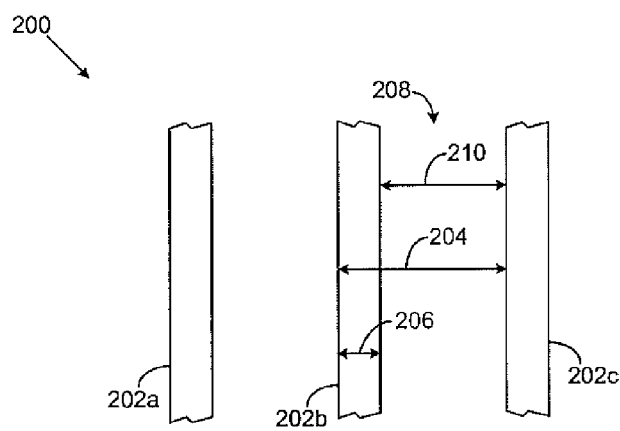
FIG. 2 illustrates a portion of a wafer that may be fabricated in accordance with one embodiment of this disclosure.

FIG. 2 illustrates a portion of a wafer 200 that may be fabricated in accordance with one embodiment of this disclosure. The wafer 200 comprises a plurality of polysilicon lines 202, three of which are illustrated in FIG. 2. The wafer 200 has an increased-size pitch 204, which is larger than a standard pitch size used in semiconductor device fabrication. For embodiments in which the wafer 200 is fabricated using a photolithography tool having a wavelength of 248 nm, an increased-size pitch is a pitch that is at least 600 nm. As described in more detail below, for some embodiments, the increased-size pitch 204 may comprise about 800 nm.

The polysilicon lines 202 each have a reduced-size development inspection critical dimension (DICD) 206, which is smaller than a standard DICD size used in semiconductor device fabrication. This is because the DICD size, which is dependent on the pitch size, decreases as the pitch size increases. Thus, an increased-size pitch 204 results in a reduced-size DICD 206. For embodiments in which the wafer 200 is fabricated using a photolithography tool having a wavelength of 248 nm, a reduced-size DICD is a DICD that is at most 0.14 μm. As described in more detail below, for some embodiments, the reduced-size DICD 206 may comprise about 0.13 μm.

Between each pair of adjacent polysilicon lines 202 is a drain region 208 in which drain contacts may be formed after further etching. As used herein, references to "drain" may include a drain and/or a source. The drain regions 208 each have a drain region size 210 that is the difference between the pitch 204 and the DICD 206. In addition, after further etching, the polysilicon lines 202 may each have a reduced-size final inspection critical dimension (FICD) and corresponding reduced-size channel length, both of which are smaller than the standard sizes used in semiconductor device fabrication. For embodiments in which the wafer 200 is fabricated using a photolithography tool having a wavelength of 248 nm, a reduced-size FICD and a reduced-size channel length are each at most 0.12 μm. As described in more detail below, for some embodiments, the reduced-size FICD and the reduced-size channel length may each comprise about 0.11 μm.

Figure 3:
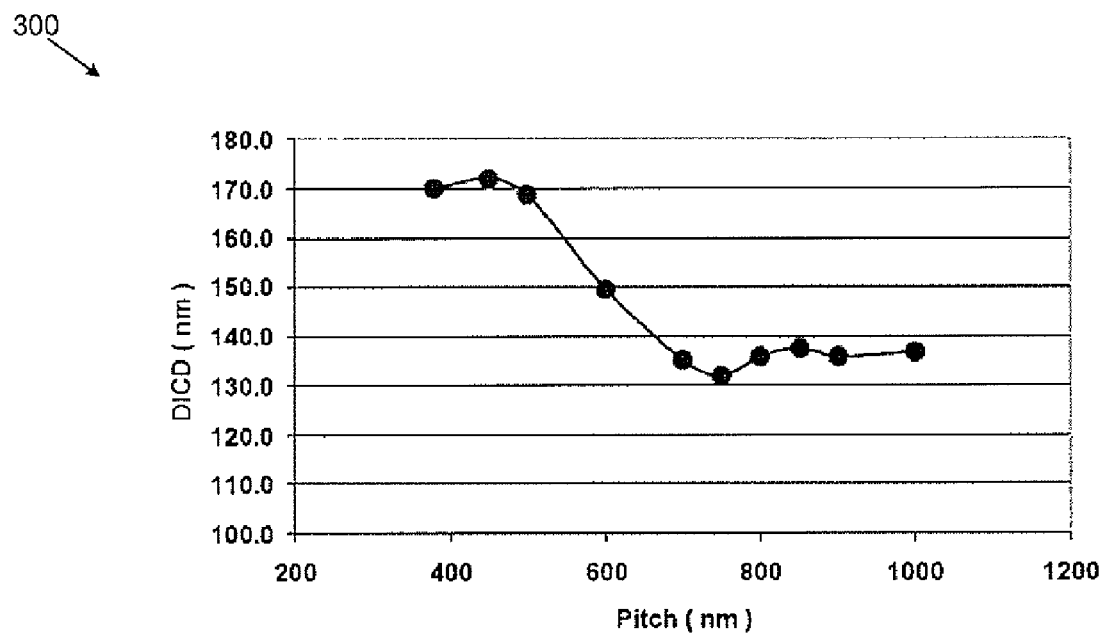
FIG. 3 is a graph illustrating the relationship between critical dimension and pitch for the wafer of FIG. 2 in accordance with one embodiment of this disclosure.

FIG. 3 is a graph 300 illustrating the relationship between development inspection critical dimension (DICD) 206 and pitch 204 for the wafer 200 in accordance with one embodiment of this disclosure. For the illustrated embodiment, the wafer 200 is fabricated using a photolithography tool having a wavelength of 248 nm.

Thus, as shown in the graph 300, as the pitch 204 increases, the DICD 206 generally decreases. When the pitch 204 increases to about 700 nm or more, the DICD 206 decreases to between 0.13 and 0.14 μm. At these dimensions, with further trimming, a 0.11-μm feature may be achieved on the wafer 200. However, as described below in connection with FIG. 4, in addition to DICD 206, process margin may also be taken into consideration when selecting a pitch 204.

Figure 4:
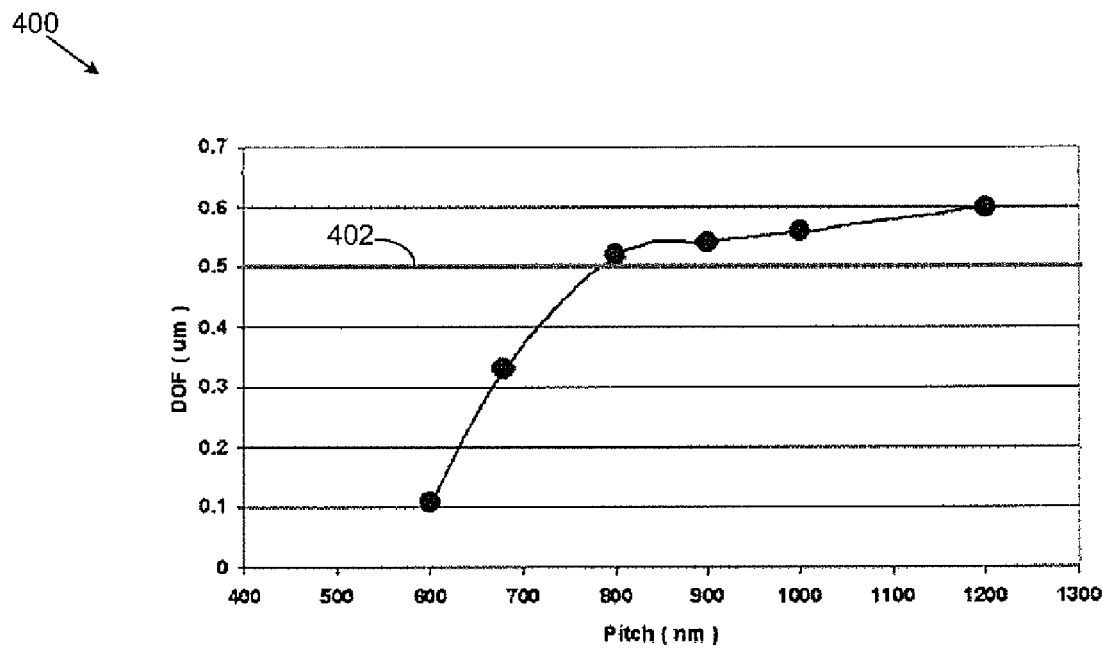
FIG. 4 is a graph illustrating the relationship between depth-of-focus and pitch for the wafer of FIG. 2 in accordance with one embodiment of this disclosure.

FIG. 4 is a graph 400 illustrating the relationship between depth-of-focus (DOF) and pitch 204 for the wafer 200 in accordance with one embodiment of this disclosure. As with the graph 300, for the illustrated embodiment of the graph 400, the wafer 200 is fabricated using a photolithography tool having a wavelength of 248 nm. The graph 400 represents a 110-nm polysilicon, single pitch common window. This corresponds to a DICD 206 of about 0.135 μm. With trimming during a subsequent poly etch process, the FICD and channel length for this embodiment may each be about 0.11 μm.

For device size consideration, a minimum possible pitch 204 is generally desired. However, as shown in the graph 400, the depth-of-focus, which represents the process margin, decreases as pitch 204 decreases. For mass production, the minimum depth-of-focus that is generally desired is 0.5 μm. This level is indicated by the line 402 in the graph 400. Accordingly, to meet this minimum depth-of-focus, a pitch 204 of about 800 nm may be selected for the illustrated embodiment.

Figure 5:
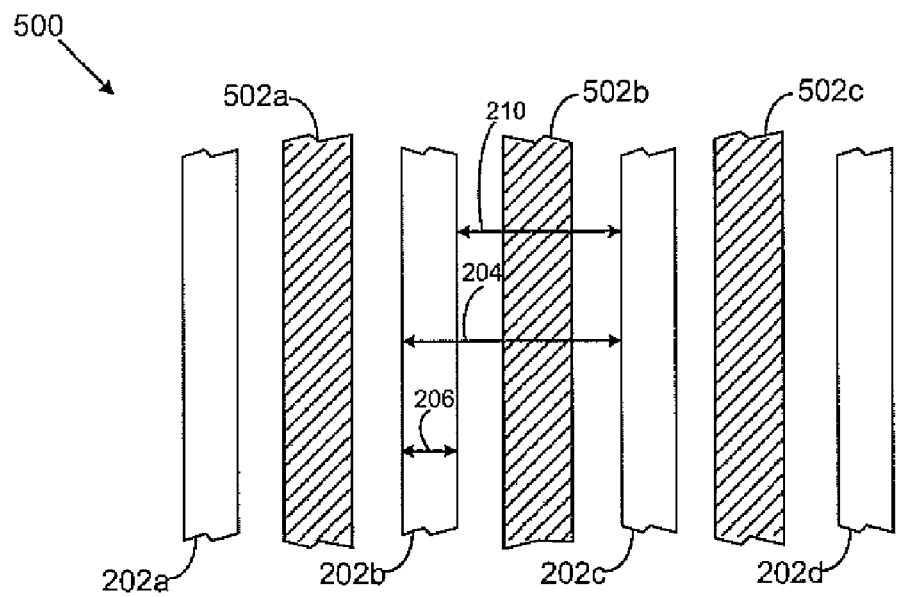
FIG. 5 illustrates a portion of a wafer including trenches that may be fabricated in accordance with one embodiment of this disclosure.

FIG. 5 illustrates a portion of a wafer 500 that may be fabricated in accordance with one embodiment of this disclosure. The wafer 500 may correspond to the wafer 200 illustrated in FIG. 2. However, the wafer 500 of FIG. 5 comprises trenches 502 that have been etched between the polysilicon lines 202. Thus, the wafer 500 and the wafer 200 may be the same wafer at different stages of fabrication.

As described above, a larger pitch 204 is generally preferred for mass manufacture because of the corresponding larger process margin. In addition, a larger pitch 204 leads to a decreased DICD 206 and channel length, which is desired. However, using an increased-size pitch 204 increases the drain region size 210 between adjacent polysilicon lines 202, resulting in an increase in parasitic capacitance. This parasitic capacitance causes a decrease in device speed and an increase in power consumption.

Because the purpose of increasing the pitch 204 is to reduce the DICD 206 (and thus channel length) and thereby increase device speed and reduce power consumption, the increase in parasitic capacitance introduced by the increased pitch 204 may be minimized in order to prevent the loss of the intended benefits of an increased-size pitch 204. Therefore, for the embodiment illustrated in FIG. 5, a trench 502 is etched between each pair of adjacent polysilicon lines 202 in order to reduce the parasitic capacitance. For some embodiments, each trench 502 may comprise a minimum width of about 0.28 μm. This allows source and drain regions to be implemented with a minimized dimension, while providing for a channel length of at most about 0.11 μm.

Figure 6:
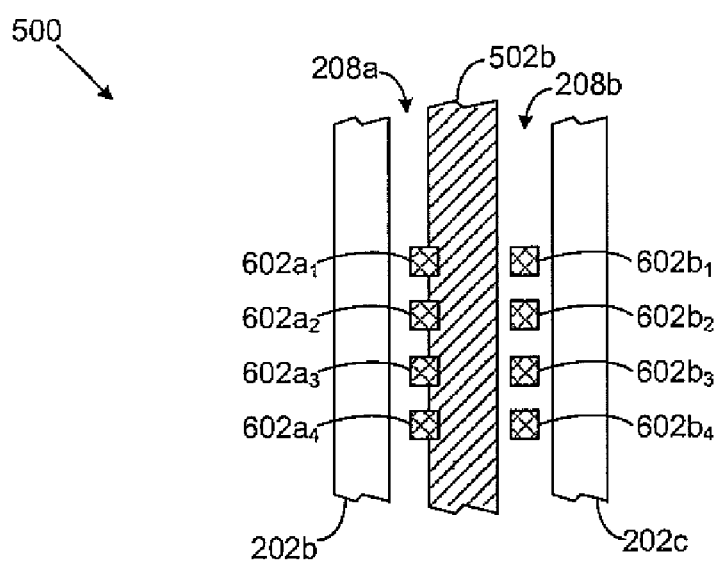
FIG. 6 illustrates possible contact misalignment during fabrication of the wafer of FIG. 5 in accordance with one embodiment of this disclosure.

FIG. 6 illustrates possible contact misalignment during fabrication of the wafer 500 in accordance with one embodiment of this disclosure. As illustrated in FIG. 6, each drain region 208 is divided into two sub-regions 208a and 208b because of the presence of the trenches 502 etched between the polysilicon lines 202. Each sub-region 208a and 208b comprises less than half the space of the full drain region 208 due to the space consumed by the trench 502. Therefore, because each sub-region 208a and 208b is substantially smaller than the full drain region 208, drain contacts 602 may be misaligned more easily.

For example, as shown in FIG. 6, a first set of contacts 602a may fall on the interface between the trench 502b and the drain sub-region 208a, while a second set of contacts 602b are aligned properly on the drain sub-region 208b. For the misaligned contacts 602a, a subsequent metallization process could result in a short between the contacts $602a_{1\text{-}4}$ and the substrate.

In order to avoid this possibility for misalignment, each half finger may be formed into a device. Instead of simply resulting in two devices being implemented in parallel, this solution still has the benefit of a reduced-size DICD 206, along with a reduction of about half in parasitic capacitance and resistance. As another solution, the design rules for fabricating devices may be optimized. For example, by setting a limit on the space between a polysilicon line 202 and a trench 502, misalignment may be avoided. Finally, a self-aligned contact process may be implemented that eliminates the possibility of harmful effects due to any misalignment.

FIGS. 7A-G illustrate such a self-aligned contact process for fabricating the wafer 500 in accordance with one embodiment of this disclosure. For this embodiment, a drain contact 602a is misaligned, as described above in connection with FIG. 6. However, the misalignment will not result in a short between the contact 602a and a substrate 700 of the device.

Figure 7A:
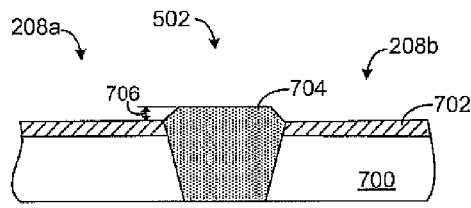
FIGS. 7A-G illustrate a self-aligned contact process for fabricating the wafer of FIG. 5 in accordance with one embodiment of this disclosure.

As indicated in FIG. 7A, FIGS. 7A-G illustrate cross-sectional views of a drain region 208, which is divided into sub-regions 208a and 208b by a trench 502. Also, as shown in FIG. 7A, the drain sub-regions 208a and 208b comprise a drain layer 702 formed over a substrate 700 using any suitable technique. For example, the drain layer 702 may be formed by an implantation and diffusion process performed on the substrate 700.

After the trench 502 is etched within the drain region 208, a shallow trench isolation (STI) 704 that comprises any suitable type of oxide may be formed in the trench 502. For a particular embodiment, the trench 502, and thus the STI 704, may be formed substantially in the center of the drain region 208 such that the sub-regions 208a and 208b are substantially the same size as each other. The top of the STI 704 is higher than the surface of the drain layer 702. The distance between the surface of the drain layer 702 and the top of the STI 704 may be referred to as a step size 706.

Figure 7B:
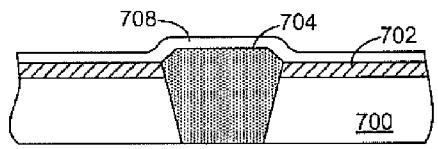

As shown in FIG. 7B, a first oxide layer 708 is formed outwardly from the drain layer 702 and the STI 704. The first oxide layer 708 may comprise any suitable type of oxide and may be formed using any suitable deposition technique. The first oxide layer 708 has a thickness that is less than the step size 706. For example, for a particular embodiment, the step size 706 may be greater than 400 Å and the first oxide layer 708 may have a thickness of about 100 Å.

Figure 7C:
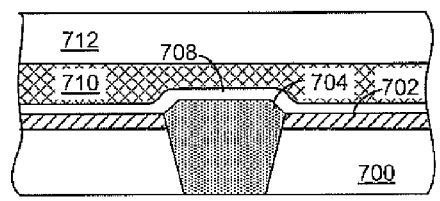

As shown in FIG. 7C, a nitride layer 710 is formed outwardly from the first oxide layer 708. The nitride layer 710 may comprise any suitable thickness and type of nitride and may be formed using any suitable deposition technique. In addition, a second oxide layer 712 is formed outwardly from the nitride layer 710. The second oxide layer 712 may comprise any suitable thickness and type of oxide and may be formed using any suitable deposition technique.

Conventional self-aligned contact processes provide a nitride layer directly over a drain layer. Thus, the nitride is in direct contact with the silicon. During a typical nitride deposition process, compressive or tensile mechanical stress is used. This increases the drain junction leakage current. Therefore, in the illustrated self-aligned contact process, the first oxide layer 708 may serve as an interfacial layer and eliminate the negative impact of nitride deposition in forming the nitride layer 710.

Figure 7D:
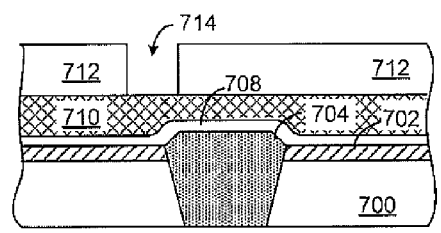
Figure 7E:
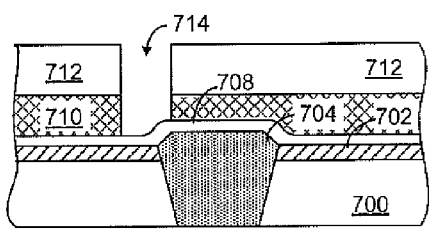
Figure 7F:
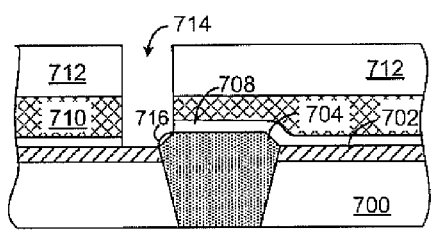

As shown in FIG. 7D, a contact opening 714 is etched through the second oxide layer 712 using an etch process that stops on the nitride layer 710. Next, as shown in FIG. 7E, the contact opening 714 is further etched through the nitride layer 710 using an etch process that stops on the first oxide layer 708. Finally, as shown in FIG. 7F, the contact opening 714 is completed with an etch through the first oxide layer 708 using an etch process that stops on the silicon of the drain layer 702.

This final etch process that etches the first oxide layer 708 and stops on the silicon of the drain layer 702 is highly selective and generally well-controlled. As a result, overetching into the silicon may be minimized with this etch process. In addition, this final etch for the contact opening 714 may be a vertical etch. Therefore, because the first oxide layer 708 is not as thick as the step size 706, a spacer 716 remains of the first oxide layer 708 such that the interface between the drain layer 702 and the STI 704 is not exposed.

Figure 7G:
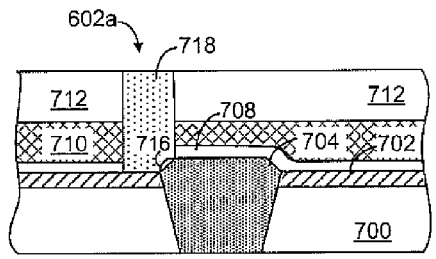

Thus, as shown in FIG. 7G, a drain contact 718 (which corresponds to the misaligned drain contact 602a) that comprises any suitable type of metal is formed in the contact opening 714. This drain contact 718 is not shorted to the substrate 700 because the final etch process does not over-etch into the silicon and because the spacer 716 prevents exposure of the drain layer/STI interface.

Figure 8:
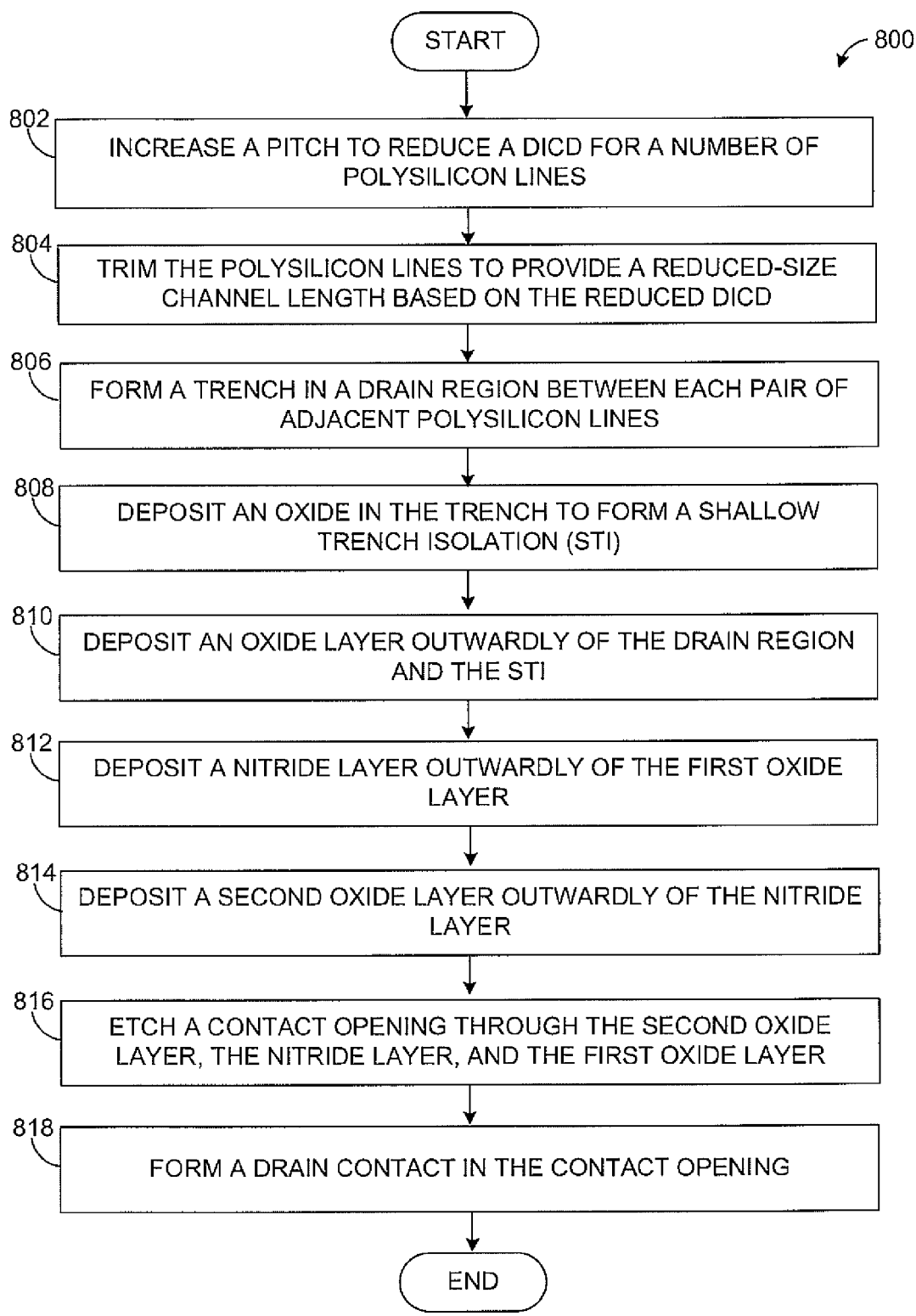
FIG. 8 illustrates an example method for scaling a channel length in a semiconductor device in accordance with one embodiment of this disclosure.

FIG. 8 illustrates an example method 800 for scaling a channel length in a semiconductor device in accordance with one embodiment of this disclosure. A pitch is increased to reduce a DICD for a number of polysilicon lines at step 802. This could include increasing the pitch to approximately 800 nm. The polysilicon lines are trimmed at step 804. The polysilicon lines are trimmed to provide a reduced-size channel length, based on the reduced DICD, for each polysilicon line. Each pair of adjacent polysilicon lines includes a drain region between the polysilicon lines. In some embodiments, a trench is formed in each drain region at step 806. In particular embodiments, the trench is approximately 0.28 μm in width.

The following steps can be performed for each pair of adjacent polysilicon lines. An oxide is deposited in the trench to form a shallow trench isolation (STI) at step 808. The top surface of the STI may be higher than the surface of the drain region by a step size. An oxide layer is deposited outwardly of the drain region and the STI at step 810. The thickness of the oxide layer may be less than the step size. A nitride layer is deposited outwardly of the first oxide layer at step 812, and a second oxide layer is deposited outwardly of the nitride layer at step 814. A contact opening is etched through the second oxide layer, the nitride layer, and the first oxide layer at step 816. After the etching, a spacer remains of the first oxide layer. A drain contact is formed in the contact opening at step 818.

It may be advantageous to set forth definitions of certain words and phrases that have been used within this patent document. The term "couple" and its derivatives refer to any direct or indirect communication between two or more components, whether or not those components are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The term "each" means every one of at least a subset of the identified items. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method for scaling channel length in a semiconductor device, comprising:
    increasing a pitch to reduce a development inspection critical dimension (DICD) for a plurality of polysilicon lines; and
    trimming the polysilicon lines to provide a reduced-size channel length, based on the reduced DICD, for each polysilicon line.

2. The method of claim 1, wherein the pitch comprises about 800 nm.

3. The method of claim 1, wherein each pair of adjacent polysilicon lines comprises a drain region between the polysilicon lines, the method further comprising forming a trench in each drain region.

4. The method of claim 3, the trench comprising a width of about 0.28 μm.

5. The method of claim 3, further comprising, for each pair of adjacent polysilicon lines:
    depositing an oxide in the trench to form a shallow trench isolation (STI) having a top surface that is higher than a surface of the drain region by a step size; and
    depositing a first oxide layer outwardly of the drain region and the STI, the first oxide layer having a thickness less than the step size.

6. The method of claim 3, wherein the semiconductor device is fabricated using a photolithography tool having a wavelength of 248 nm, and wherein the pitch comprises about 800 nm, the trench comprises a width of about 0.28 μm, and the reduced-size channel length comprises about 0.11 μm.

7. The method of claim 5, further comprising, for each pair of adjacent polysilicon lines:
    depositing a nitride layer outwardly of the first oxide layer;
    depositing a second oxide layer outwardly of the nitride layer;
    etching a contact opening through the second oxide layer, the nitride layer and the first oxide layer such that a spacer remains of the first oxide layer; and forming a drain contact in the contact opening.

8. A semiconductor wafer, comprising:
a plurality of polysilicon lines spaced apart by an increased-size pitch, the increased-size pitch reducing a development inspection critical dimension (DICD): and
a trench formed in a drain region between each pair of adjacent polysilicon lines.

9. The semiconductor wafer of claim 8, wherein the increased-size pitch comprises about 800 nm.

10. The semiconductor wafer of claim 8, wherein the trench comprises a width of about 0.28 μm.

11. The semiconductor wafer of claim 8, further comprising, for each pair of adjacent polysilicon lines, at least one drain contact formed between the trench and one of the pair of adjacent polysilicon lines.

12. The semiconductor wafer of claim 8, further comprising a plurality of transistors, wherein each transistor has a gate formed from one of the polysilicon lines and has a reduced-size channel length.

13. The semiconductor wafer of claim 12, wherein the transistors are fabricated using a photolithography tool having a wavelength of 248 nm, and wherein the increased-size pitch comprises about 800 nm, the trench comprises a width of about 0.28 μm, and the reduced-size channel length comprises about 0.11 μm.

14. The semiconductor wafer of claim 12, wherein the transistors are fabricated using a photolithography tool having a wavelength of 248 nm, and wherein the transistors are arranged to form a ring oscillator having a gate delay time of about 15 ps.

15. A method for aligning a drain contact in a semiconductor device having a scaled channel length, comprising:
etching a trench in a substrate;
forming a drain layer over the substrate, the drain layer comprising silicon;
depositing an oxide in the trench to form a shallow trench isolation (STI) having a top surface that is higher than a surface of the drain layer by a step size; and
depositing a first oxide layer outwardly of the drain layer and the STI, the first oxide layer having a thickness less than the step size.

16. The method of claim 15, further comprising:
depositing a nitride layer outwardly of the first oxide layer; and
depositing a second oxide layer outwardly of the nitride layer.

17. The method of claim 15, wherein the first oxide layer has a thickness of about 100 Å.

18. The method of claim 16, further comprising:
etching a contact opening through the second oxide layer using an etch process that stops on the nitride layer;
etching the contact opening through the nitride layer using an etch process that stops on the first oxide layer;
etching the contact opening through the first oxide layer using an etch process that stops on the silicon of the drain layer; and
forming a drain contact in the contact opening.

19. The method of claim 18, wherein etching the contact opening through the first oxide layer comprises etching the contact opening through the first oxide layer using a vertical etch process.

20. The method of claim 18, wherein a spacer remains of the first oxide layer after etching the contact opening through the first oxide layer.

* * * * *